United States Patent
Correale, Jr. et al.

(10) Patent No.: US 6,229,750 B1
(45) Date of Patent: May 8, 2001

(54) METHOD AND SYSTEM FOR REDUCING POWER DISSIPATION IN A SEMICONDUCTOR STORAGE DEVICE

(75) Inventors: Anthony Correale, Jr.; Robert James Lynch, both of Raleigh, NC (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/408,622

(22) Filed: Sep. 30, 1999

(51) Int. Cl.[7] ...................................................... G11C 7/00
(52) U.S. Cl. .................... 365/226; 365/233; 365/189.05; 365/154
(58) Field of Search ................................. 365/226, 154, 365/189.08, 189.05, 233

(56) References Cited

U.S. PATENT DOCUMENTS

| | | | |
|---|---|---|---|
| 4,912,709 | 3/1990 | Teske et al. | 371/22.1 |
| 5,072,132 | 12/1991 | Samaras et al. | 307/272.1 |
| 5,455,931 | 10/1995 | Camporese et al. | 395/550 |
| 5,719,878 | 2/1998 | Yu et al. | 371/22.3 |
| 5,789,957 | 8/1998 | Fucili et al. | 327/203 |
| 6,061,289 | * 5/2000 | Itoh et al. | 365/226 |

* cited by examiner

Primary Examiner—Huan Hoang
(74) Attorney, Agent, or Firm—John D. Flynn; Daniel E. McConnell

(57) ABSTRACT

A system and method of controlling the operation of a storage device (a semiconductor latch in its preferred embodiment) to reduce the power consumed by the storage device. The system uses a split clock signal to control the operation of the latch, with an early enable signal and a late enable signal being operable to turn the latch on when needed and to turn it off when it is not needed. More particularly, the present invention logically generates clocking control signals for the latch using the early enable signal and the late enable signal to control the operation of the latch and to reduce power consumption and allow for an increased period of time to make a decision whether to turn off the early enable signal. One clock input is generated from one of the enable signals and the other is a function of both of the enable signals and the redundant enable signal is used in an AND gate late in the generation of the clocking signal, thus using a redundancy in the enable signals to control one of the clock inputs and provide control of the storage device for an extended period of time.

5 Claims, 3 Drawing Sheets

METHOD AND SYSTEM FOR REDUCING POWER DISSIPATION IN A SEMICONDUCTOR STORAGE DEVICE

BACKGROUND OF THE INVENTION

1. Field of the Invention

The present invention is an improved system and method for reducing power dissipation in a semiconductor device by controlling the operation of the device through the use of an improved clock splitting arrangement. More particularly, the present invention uses an improved clock splitting circuit and logic to provide a better turnoff arrangement for a semiconductor storage device such as a master/slave latch where the turn off is accomplished earlier in the cycle which reduces power consumption and allows for a later turn off through the use of an early and late control signals based on early and late enable signals and logic to combine the control signals.

2. Background Art

As semiconductor devices get larger with more components fabricated on a single chip, it becomes important to reduce the power consumed and the heat generated by the chip. The power consumed in a factor of several different variables, including particularly the number of times that a semiconductor changes states. It would be therefore be desirable to turn off the semiconductor elements which are not being used, and turn them off as early as possible, while allowing for a decision that the semiconductor storage may not be needed still to be determined later in the cycle without losing the opportunity to turn off the semiconductor storage during that cycle.

Several systems for controlling power consumption in a semiconductor storage through the use of a clock splitter have been proposed. One of these involved the use of a slit clock to turn the storage device off to reduce the power consumed. Another system involved the use of wait states (or a lost cycle) when the devices were shut down (to avoid losing data). Still another approach slows down the clock (elongating the clocking signal) to allow for reduced power consumption in the semiconductor storage.

However, the prior art devices have the disadvantages that more power than necessary was still consumed by the semiconductor storage device, since the device was on and changing states more than necessary. Either the latch device was not turned off as early as possible to avoid consuming power or it was not turned off when it could have been turned off.

Further, in some systems, an additional cycle (a so-called "wait state") was required when the latches are turned on (or turned off), reducing performance of the system and the latches. Also, when the clock signal is elongated and therefore slowed down, the performance of the system (in cycles per unit of time) is undesirably reduced.

Accordingly, the prior art latch control circuits consumed more power than was necessary and could have been turned off without adverse effect on the logic.

Other disadvantages and limitations of the prior art systems will be apparent to those skilled in the art to which the invention applies in view of the following description of the preferred embodiment of the present invention, taken together with the accompanying drawings and the appended claims.

SUMMARY OF THE INVENTION

The present invention overcomes the limitations and disadvantages of the prior art systems by providing an improved semiconductor storage device which consumes less power while operating to allow full functions at full speed (without unnecessary "wait states" and without slowing the clock).

The present invention has the advantage that it is simple and easy to fabricate and does not require substantial additional cost, hardware or design effort.

The present invention has the additional advantage that it is fast and provides for a shut down of the semiconductor storage device when it is not needed, yet renders the storage device fully operational when data for processing in the semiconductor storage device is present.

The system for controlling the operation of the semiconductor storage devices in the present invention also has the benefit that it does not require additional cycles (or wait states) to effect turnoff or to recover from a turnoff. The system of the present invention also does not require that the clock be slowed down (e.g., through use of elongated cycles), with the attendant reduction in performance.

The present system also allows for an extended period during which the decision can be made to turn off the logic of a semiconductor latch without losing the opportunity to turn off the logic during a particular cycle, while the clock is at the rated maximum frequency. The use of an earlier early enable signal and a later early enable signal allows making a decision to turn off the relevant logic early in the cycle, while still allowing a later decision to be made to turn off the logic.

The present invention allows a determination to be made at several different times during the cycle that a semiconductor storage will not be needed during that cycle and to turn off the logic and generation of clock signals. If it is known immediately at the beginning of the cycle that the memory will not be needed, an early clocking signal is suppressed and a late clocking signal is not generated and a large amount of the power that the semiconductor memory and the associated clock splitting circuitry would otherwise consume would be saved. If it is determined later in the cycle that the semiconductor memory will not be needed during the cycle (before the middle of the cycle), the early clocking signal can still be suppressed, with a lesser, but still significant saving in power consumption. Finally, if it is determined late in the cycle that the semiconductor memory will not be needed, then a late enable (or disable) signal is generated to turn off part of the semiconductor memory and save some of the power which would otherwise be consumed in the semiconductor memory and associated clock splitting circuitry, an amount of savings which is less than is saved if the semiconductor memory were shut down earlier.

Other objects advantages of the present invention will be apparent to those skilled in the relevant art in view of the following description of the preferred embodiment, taken together with the accompanying drawings and the appended claims.

BRIEF DESCRIPTION OF THE DRAWINGS

The present invention is an improved semiconductor control system and method in which.

DETAILED DESCRIPTION OF THE PREFERRED EMBODIMENT

In the following description of the preferred embodiment, the best implementation of practicing the invention presently known to the inventors will be described with some particularity. However, this description is intended as a broad, general teaching of the concepts of the present invention in a specific embodiment but is not intended to be limiting the present invention to that as shown in this embodiment, especially since those skilled in the relevant art will recognize many variations and changes to the specific structure and operation shown and described with respect to these figures.

Figure 1:
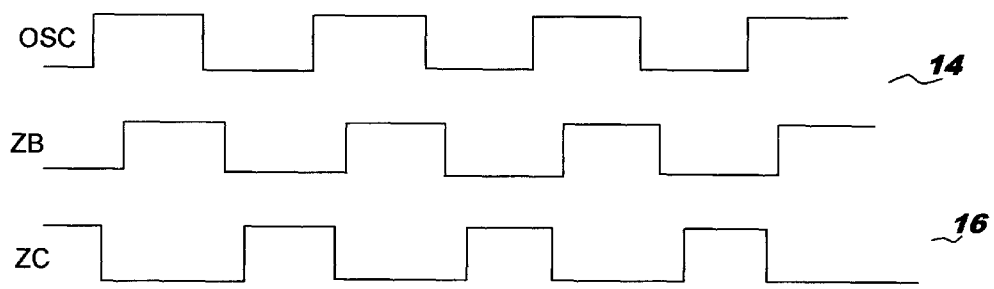
FIG. 1 is a diagram of a timing diagram of the clocking signals used in the present invention.

FIG. 1 is a timing diagram useful in the understanding of the present invention with split clock signals ZB and ZC. A free-running oscillator OSC generates a periodic square wave 12. A ZB clocking signal 14 for the clock signal ZB is generated in a known manner and is considered "in-phase" with the oscillator (although slightly offset) since the square wave 12 from the oscillator OSC and the ZB clocking signal 14 for the clocking signal ZB are of like polarity through most of the cycle—both are high together and both are low together, except for a small lag or delay. A ZC clocking signal 16 for the clock signal ZC is generates as an out-of-phase clocking signal, since it is of opposite polarity through most of the cycle—when the oscillator is high, the ZC clocking signal is low and vice versa, again, except for a small lag. The ZB clocking signal and the ZC clocking signal are the output of the clock splitter described later in connection with FIGS. 5–7 and are used as clocking signals (inputs) in the semiconductor memory shown in FIG. 2.

Figure 2:
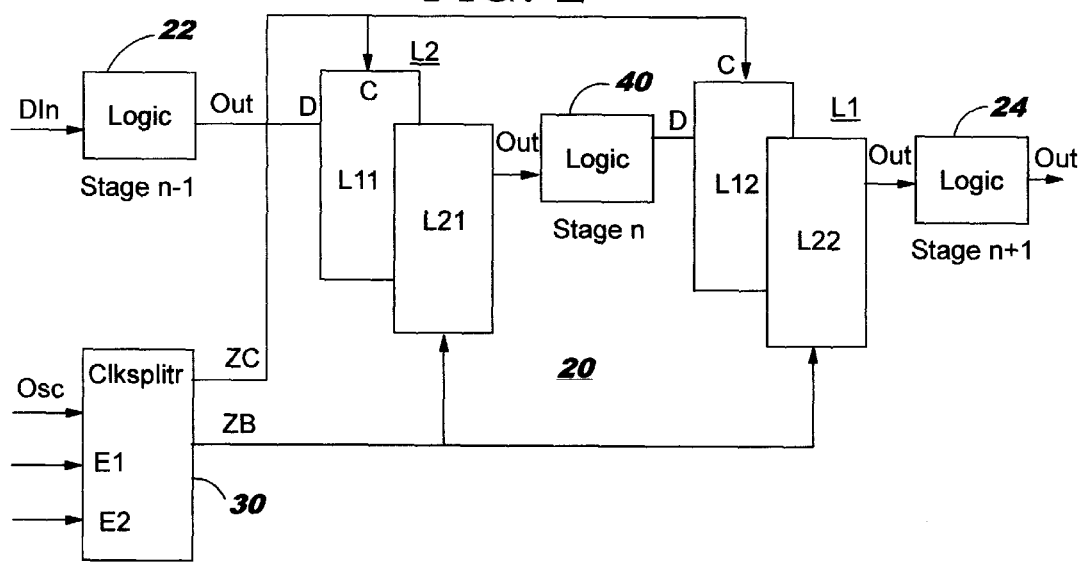
FIG. 2 is a schematic diagram of a logic system useful in the present invention.

FIG. 2 illustrates a logical block diagram for a split clock latch circuit of the present invention. The latch 20 includes a master-slave set of flip-flops for stage n of the logic. Also shown, in block form, are a preceding stage 22 of the logic (stage n−1) and a subsequent stage 24 of the logic (stage n+1). A clock splitting system 30 (with its inputs OSC and an early enable signal E1 and a late enable signal E2 and its clocking output signals ZB,ZC) is shown in block form in this FIG. 2 but is shown and described in greater detail in connection with later figures, particularly FIGS. 5, 6 and 7. The master-slave flip-flops of the latch 20 include a launching latch L2 and a capturing latch L1, each of which latches has a launching set of gates (L21 and L22, respectively) and a capturing set of gates (L11 and L12, respectively). Each latch includes an input D, an output OUT and a pair of clock inputs B,C coupled to the clocking signals ZB and ZC, respectively. Conventional logic 40 connects the launching gates L21 with the capturing gates L12. The output OUT from the launching gates L21 is connected to the input D of the capturing gates L12 through the logic 40, and the output OUT from the L2 stage of the capturing latch L1 is the input to the next stage 24 of the logic (stage n+1). The D input of the launching latch L2 is the output OUT of the preceding stage 22 of the logic (stage n−1).

The clock signal ZC is used to control the capturing set of gates (L11 for the flip-flop L2). If the clock signal ZC is not present (because it was turned off), then no data will flow in the entire master/slave assembly and power will be conserved. As was shown in the FIG. 1, the ZC clock signal operates out of phase with the oscillator OSC and, if it is to be present, will be present during the negative or second half of the cycle, that is, until the rising edge of the oscillator OSC. The clock signal ZB operates during the positive half of the cycle of the oscillator OSC and serves as a control of the launching set of gates L21,L22. By turning off the clock signal ZB, the propagation of the information from the capturing set of gates (e.g., L11 for the first flip-flop) into the launching set of gates L21 is avoided, saving some of the power (but, since the capturing set of gates L11 have already been operating by the time that the launching gates L21 are turned off, the power savings is not as great as if the entire memory had been turned off through the use of the clock signal ZC.

Figure 3:
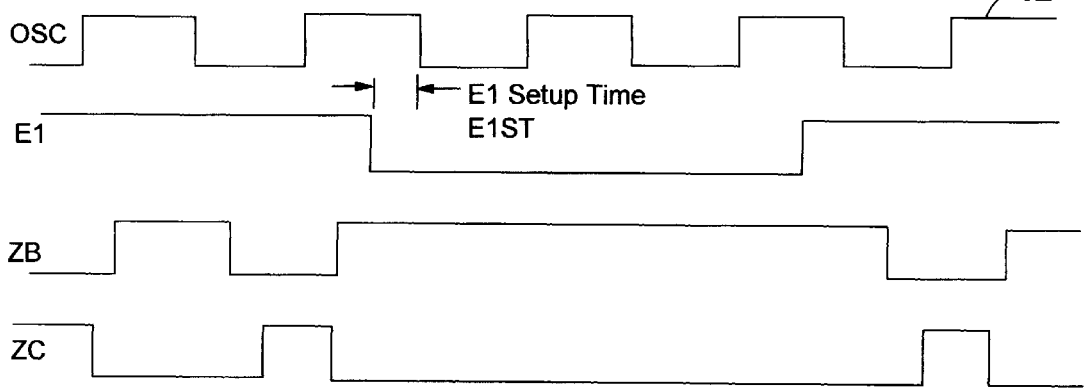
FIG. 3 is a timing diagram showing the oscillator and clocking signals, illustrating timing features of the present invention with a first or early enable signal.

FIG. 3 is a timing diagram of the operation of the clocking signals of the present invention, based upon the operation of the early enable signal E1. The early enable signal E1 is a signal which is generated early in the cycle to enable (or disable, depending on the polarity) the operation of the latch during that cycle. The falling edge of the early enable signal E1 occurs slightly prior to the filling transition of the oscillator OSC, a time interval labeled as E1ST for E1 set up time. This signal must occur in the first half of the cycle since the E1 generation logic is a half cycle path, so this is a disadvantage if this is the only signal used to control the turn on or turn off of the latch. When the early enable signal E1 is high, the clock signals ZB,ZC are free-running and follow the sequence shown in FIG. 1. When the early enable signal E1 is low, then the clock signal ZB is high and the clock signal ZC is low. Ideally, there would be no overlap in the clock signals ZB and ZC, and the clock signal ZB would go away before the clock signal ZC would come up.

A semiconductor memory such as a latch consumes power when it is operating and changing states, so it is desirable to turn the device "off" and prevent it from operating when it will not be used during a cycle, and to turn it off as early in the cycle as possible. Sometimes it is known early in the cycle that the latch will not be needed. An example is when the fetch-decode-execute register when the instruction queue is empty, indicating that there is nothing to decode and therefore no need for a fetch, decode and execute cycle of the fetch-decode-execute processor. In that case of an empty instruction queue, the early enable signal could be set so that the appropriate register could be turned off early and avoid drawing power to either change the state of the latch (or even to maintain what is in the latch). This is an example of an early enable (or early disable, depending on the point of view) signal. In some operations, it can be determined before the middle of the cycle that the memory will not be needed for the current operation and can be turned off.

However, it is far more common in the example of a set of execute registers that a conditional branch instruction (an instruction such as Jump-on-zero in register x to an address y). When the test is performed (the contents of the register x tested for being zero) and determined that the condition is not met (the value of the register does not meet the criteria that it is zero), then there is no jump and no need for the address in the register. However, if the test is met (the register x is zero), then the latches must be free running to store the address y so that the jump may be accomplished during the same cycle. In this case of a conditional instruction, it is not until late in the execution cycle that it is known whether the branch is taken and the storage device or latch (the address register) must have the data ready in case the branch is taken, but it is desirable that the latch be tuned off if it is determined that the data would not be needed, and shut down as quickly as possible to reduce the power consumed.

In these cases, the designer of the instruction set and the logic determines what conditions may exist where the memory will not be needed during the cycle and how long it will take to generate the information necessary to control the logic. The generation of information as to whether the memory will be needed is conventional and depends on the instruction set and the logic to determine how the decisions will be made.

Accordingly, the present invention uses two enable signals (which are also might be considered disable signals, since the absence of the signal provides for the device to be turned off or not operating). For convenience, one of these signals has been identified as an early enable signal and the other one a late enable signal. Generation of enable signals (or disable signals, depending on the perspective) from the operation of the device uses conventional logic techniques and is not part of the present invention.

Figure 4:
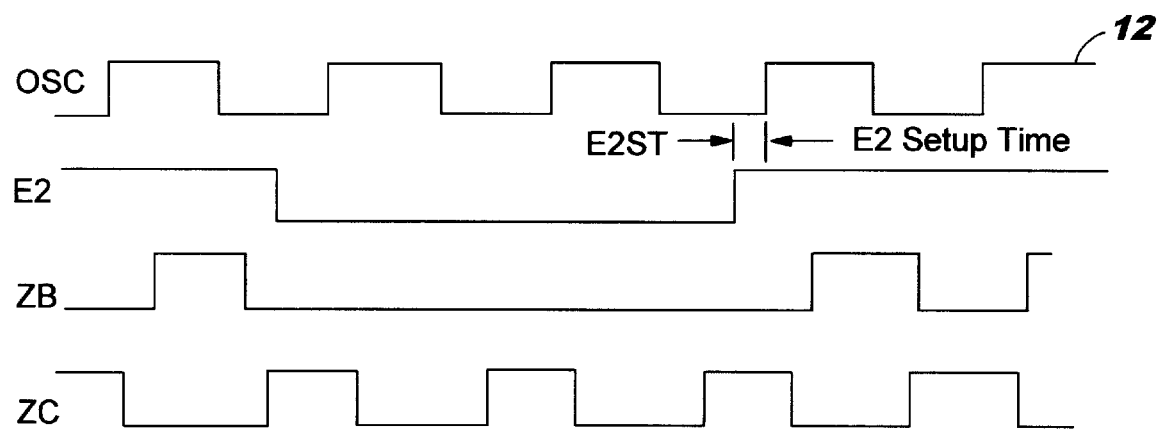
FIG. 4 is a second timing diagram showing the oscillator and clocking signals, illustrating timing features of the present invention with a second or late enable signal.

FIG. 4 illustrates the timing diagram for the late enable signal E2, which occurs a set up time E2ST prior to the rise of pulse train 12 of the oscillator OSC. When the late enable signal E2 is low, it drives the clock signal ZB to a low state to turn off the storage device of the latch 20. When the late enable signal E2 is high, the clock signal ZB runs free and allows the latch 20 to operate. In either case, the state of the late enable signal E2 is independent of and does not affect the clocking signal ZC.

Figure 5:
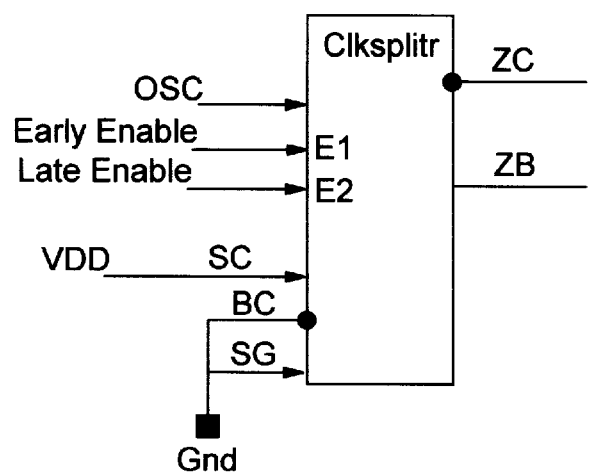
FIG. 5 is a schematic block diagram of system of the present invention.

FIG. 5 is a schematic high-level diagram of the clock splitter of the present invention. The clock splitter 30 includes inputs from the oscillator OSC, the early enable signal E1, a late enable signal E2, voltage VDD on pin SC, and pins BC,SG which are grounded at GND. The pins SC,BC,SG are primarily used during test of the device and are not functionally important during normal operation, but must be considered. As shown in this FIG. 5, the outputs of the clock splitter 30 are clocking signals ZB and ZC, with the clock signal ZC being inverted and the clock signal ZB being non-inverted. When the early enable signal E1 is low and the late enable signal E2 is high, the clock signal ZC is forced low and the clock signal ZB is forced high, freezing the master and slave latches 20, preventing any changes in state which would otherwise draw power. It also saves power in the clock splitter 30 as subsequent oscillator changes are not propagated. When the early enable signal E1 is high and the late enable signal E2 is low, then the clock signal ZB is forced low, freezing the latches, while allowing the other clocking signal ZC to run free. When both the enable signals E1,E2 are high, then the clock inputs ZB,ZC run free.

Figure 6:
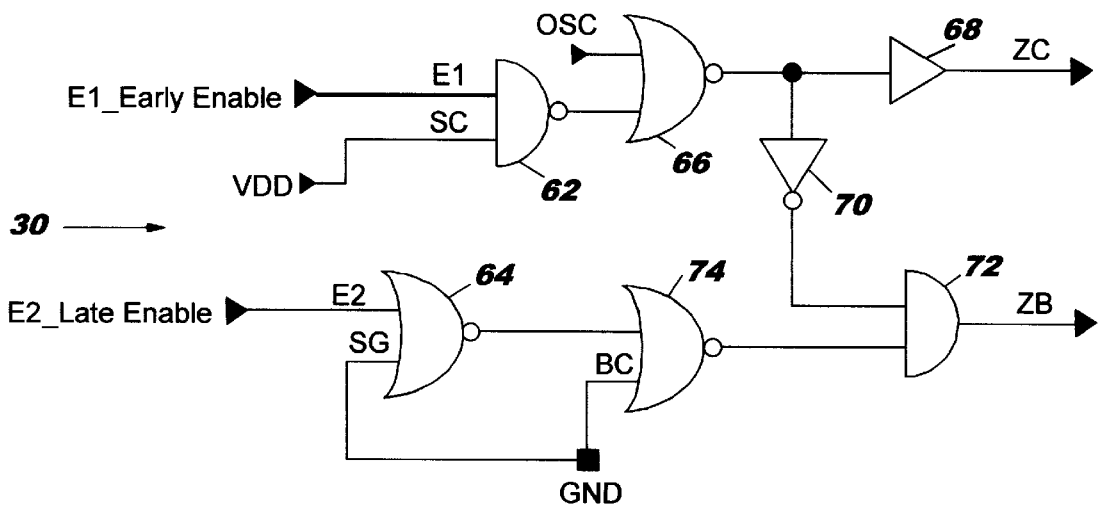
FIG. 6 is a logic diagram of the circuitry for a clock-splitting arrangement useful in a semiconductor logic system.

FIG. 6 is a detailed logic diagram of a clock splitting arrangement for the clock splitter 30 described above. The early enable signal E1 and the voltage VDD on the test pin SC are combined at NAND gate 62 (where the NAND gate provides a low true output from a logical AND function), while the late enable signal E2 is NORed together with the test pin SG tied to ground GND at a NOR gate 64 (where the NOR gate is a logical OR function with a low true output). The output of the NAND gate 62 is then combined with the oscillator OSC at a NOR gate 66 and the output of the NOR gate 66 is passed through an amplifier 68 to provide the clock input ZC to the latches. The output of the NOR gate 66 is also inverted at a logical inverter 70 and then combined in an AND function at 72 with the output from a NOR gate 74 where the output of the NOR gate 64 is combined with ground GND.

Figure 7:
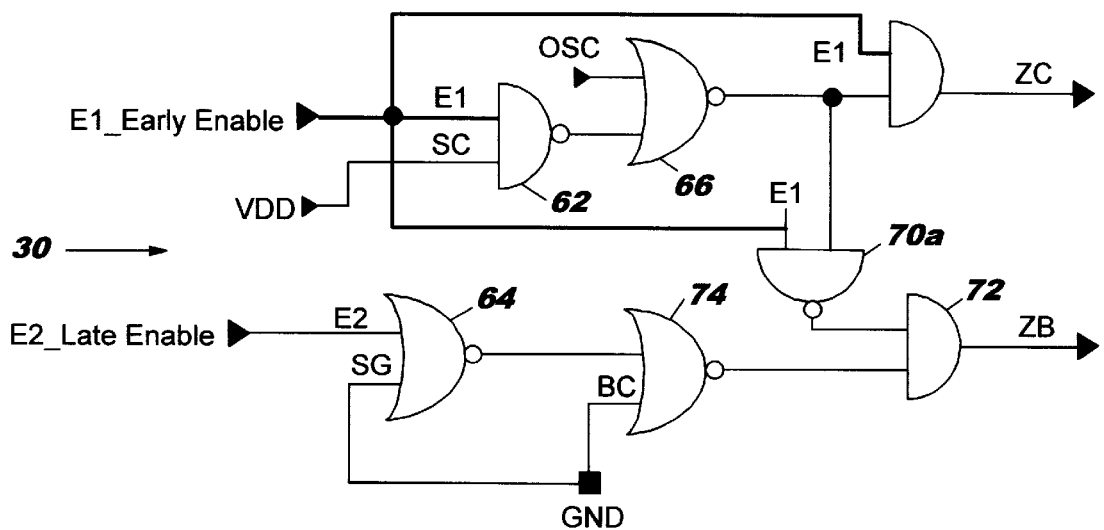
FIG. 7 is a logic diagram of the circuitry for an improved clock-splitting arrangement embodying the present invention.

FIG. 7 is a detailed logic diagram of an improved clock splitting arrangement for the improved clock splitter 30 described above. This improved clock splitting of this embodiment improves on the embodiment of FIG. 6 by providing a redundant gating of the early enable signal E1. That is, the logic in FIG. 7 is similar to that shown in FIG. 6, except that the early enable signal E1 is used as an input to an AND gate 68a (instead of the amplifier 68 in FIG. 6) and a NAND gate 70a replaces the inverter 70 of FIG. 6, with an input from the early enable signal as well as the output of the NOR gate 66. In this way, the early enable signal E1 turns off the clock signal ZB and the clock signal ZC later in the cycle (when appropriate) than the embodiment shown in FIG. 6. The earl enable signal E1 is shown as an input to the AND gate 68a and also as an input to the NAND gate 70a, this a redundant input. Since there are fewer stages of logic to disable the generation of the clock signals ZB and ZC, a decision turning off the early enable signal E1 may be made later in the cycle and still be effect the power savings. The goal of a design of this nature is to reduce the set up time which is required, and the design of FIG. 7 allows an extended period for the generation of early enable signal E1.

In this way, the early enable signal E1 can arrive later in the cycle (the positive half of the oscillator OSC pulse) and still control the operation of the clock input ZC. If the early enable signal E1 is off from the beginning, the path through the NAND gate 62 and the NOR gate 66 will result in the clock signal ZC being turned off. However, if the early enable signal E1 is generated even as the oscillator OSC starts to fall (or later, consistent with the propagation delay of the NOR gate 66), then the AND gate 68a and the AND gate 70a will still allow that early enable signal E1 to turn off the clock signals ZC,ZB, respectively. Effectively, the set up time E1ST required by the design is now a negative number, that is, the early enable signal E1 can occur after the falling edge of the oscillator OSC and still be effective. This essentially elongates the time available to make an early enable (or early disable) decision for a given cycle. Put another way, in the design of FIG. 6, the early enable signal had to occur during the first half of the cycle less the E1 set up time E1ST, but in the design of FIG. 7 the early enable decision must be made in the first half of the cycle plus the gate delay, effectively extending the period of time available to make an early enable decision.

If, during the design phase of a split clock such as in FIG. 6, it is determined that the early enable signal E1 will not arrive in time (e.g., for certain instructions) consistent with the set up time E1ST, then the designer is relegated to using the late enable signal E2 since the early enable signal E1 will remain in an active state. This results in a free-running clock signal ZC without any power savings during the first half of the cycle. If, on the other hand, the approach of the split clock of FIG. 7 is used, then the set up time E1ST is reduced, thereby enable more cycle time to be available to decide whether to use the early enable signal E1 (the preferred approach) or whether the late enable signal E2 must be used for a given instruction.

If the early enable signal E1 arrives early, the redundant aspects of the design of FIG. 7 are not needed, and the logic of gates 62,66 and 68 are used. However, if the early enable signal E1 arrives somewhat later in the cycle, then the redundant aspects using the additional input of early enable signal E1 in the gate 68a and the gate 70a are used. For example, if the early enable signal E1 is initially active, then upon the arrival of the falling edge of the oscillator OSC, the NOR gate 66 would begin to rise. AND gate 68a and NAND gate 70a would also be enabled. Now, if the early enable signal E1 were to change states to a "0" or low, it would disable the AND gate 68a, thereby blocking generation of the clock signal ZC. It would also force the output of the NAND gate 70a high (or to a "1") thereby enabling the AND gate 72 and allowing the late enable signal E2 to control the clock signal ZB.

Of course, many modifications of the present invention will be apparent to those skilled in the relevant art in view of the foregoing description of the preferred embodiment, taken together with the accompanying drawing. For example, the clocking control signals could be used to control a device other than a master-slave semiconductor latch where it is desired to turn the circuit off when it is not going to be used. Additionally, the logic shown in the logic diagram of FIG. 7 could be modified in many ways (such as with other logical gate arrangements) without departing from the spirit of the present invention. Accordingly, the foregoing description of the preferred embodiment should be considered as merely illustrative of the principles of the present invention and not in limitation thereof.

Having thus described the invention, what is claimed is:

1. A method comprising the steps of:

generating a cyclical clock signal;

generating a first enable signal during one part of a cycle of operation of an electronic device and a second enable signal during another part of the cycle;

passing the clock signal to logic and splitting the clock signal into a first clock signal and a second clock signal;

using the first clock signal to turn the electronic device off at a first time in the operating cycle in response to the state of the first enable signal; and using the second clock signal to turn the electronic device off at a time in the operating cycle later than the first time in response to the state of the second enable signal and the first enable signal, at least one of the enable signals being provided to the logic a second time close to the generation of the clock signal to provide the signal quicker and allow for a later decision on whether to turn the electronic device off during the cycle.

2. A system comprising:

a semiconductor latch including a first storage device and a second storage device, operation of the latch being responsive to a first enable signal coupled to the first storage device and a second enable signal coupled to the second storage device;

a first signal generator coupled to the first storage device for creating a control signal for the first storage device in response to the first enable signal;

a second signal generator coupled to the second storage device for creating a control signal for the second storage device in response to both the first enable signal and the second enable signal; and a control system for at least one of the signal generators which includes redundant inputs of one of the first and second enable signals so that the other of the first and second enable signals can be generated either early or late in a cycle and control the operation of the storage device.

3. A system for controlling the operation of a semiconductor latch of the type described in claim 2 wherein the second signal generator includes a logic device which performs an AND function on the first enable signal and the second enable signal.

4. A system for controlling the operation of a semiconductor latch of the type described in claim 2 wherein the first signal generator includes logic which combines the first enable signal during one half of the cycle and the second signal generator includes logic which combines the second enable signal during the other half of the cycle, with the first signal generator also including logic which is responsive to the first enable signal during a part of the other half of the cycle.

5. A system for controlling operation of a master/slave memory device including two sets of flip-flops for a stage of memory and a first and second clocking signal coupled to these flip-flops for controlling the operation of the flip-flops, the system including:

logic to generate the first clocking signal based on a early enable signal, said logic including a logical AND with a system oscillator to create a first output, with the first output combined with the early enable signal to provide the first clocking signal; and logic to generate the second clocking signal based on a late enable signal, the early enable signal and the first output.

* * * * *